(12) United States Patent
Viswanathan et al.

(10) Patent No.: US 9,589,860 B2
(45) Date of Patent: Mar. 7, 2017

(54) ELECTRONIC DEVICES WITH SEMICONDUCTOR DIE COUPLED TO A THERMALLY CONDUCTIVE SUBSTRATE

(71) Applicants: Lakshminarayan Viswanathan, Phoenix, AZ (US); Jaynal A. Molla, Gilbert, AZ (US)

(72) Inventors: Lakshminarayan Viswanathan, Phoenix, AZ (US); Jaynal A. Molla, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/508,645

(22) Filed: Oct. 7, 2014

(65) Prior Publication Data

US 2016/0099199 A1 Apr. 7, 2016

(51) Int. Cl.
*H01L 23/495* (2006.01)
*H01L 23/31* (2006.01)
(Continued)

(52) U.S. Cl.
CPC ...... *H01L 23/3114* (2013.01); *H01L 21/6835* (2013.01); *H01L 21/6836* (2013.01); *H01L 23/36* (2013.01); *H01L 23/3677* (2013.01); *H01L 23/4827* (2013.01); *H01L 23/66* (2013.01); *H01L 24/03* (2013.01); *H01L 24/05* (2013.01); *H01L 24/27* (2013.01); *H01L 24/29* (2013.01); *H01L 24/741* (2013.01); *H01L 24/743* (2013.01); *H01L 24/92* (2013.01); *H01L 24/94* (2013.01); *H01L 21/561* (2013.01); *H01L 23/49513* (2013.01); *H01L 23/49517* (2013.01); *H01L 24/32* (2013.01); *H01L 24/48* (2013.01); *H01L 24/83* (2013.01); *H01L 2221/6834* (2013.01); *H01L 2221/68318* (2013.01); *H01L 2221/68327* (2013.01); *H01L 2221/68381* (2013.01); *H01L 2224/0332* (2013.01); *H01L 2224/0345* (2013.01); *H01L 2224/0346* (2013.01); *H01L 2224/03312* (2013.01);
(Continued)

(58) Field of Classification Search
CPC . H01L 23/10; H01L 23/495; H01L 23/49582; H01L 23/49517; H01L 23/49513; H01L 23/49558
USPC ....... 257/718, 712, 313, 699, 698, 706, 707, 257/774, 766, 13
See application file for complete search history.

(56) References Cited

U.S. PATENT DOCUMENTS 7,339,267 B2 * 3/2008 Thompson ............ H01L 23/481
257/707
7,723,224 B2 5/2010 Hill et al.
(Continued)

FOREIGN PATENT DOCUMENTS

WO 2006127107 A2 11/2006

OTHER PUBLICATIONS

U.S. Appl. No. 14/089,744, filed Nov. 25, 2013, entitled "Packaged Semiconductor Devices and Methods of Their Fabrication".

*Primary Examiner* — Alexander Oscar Williams
(74) *Attorney, Agent, or Firm* — Sherry W. Schumm (57) ABSTRACT

An electronic device includes a semiconductor die having a lower surface, a sintered metallic layer underlying the lower surface of the semiconductor die, a thermally conductive flow layer underlying the sintered metallic layer, and a thermally conductive substrate underlying the thermally conductive flow layer.

34 Claims, 7 Drawing Sheets

(51) Int. Cl.
*H01L 23/36* (2006.01)
*H01L 23/367* (2006.01)
*H01L 23/00* (2006.01)
*H01L 23/482* (2006.01)
*H01L 21/683* (2006.01)
*H01L 23/66* (2006.01)
*H01L 21/56* (2006.01)

(52) U.S. Cl.
CPC ............ *H01L 2224/03436* (2013.01); *H01L 2224/03505* (2013.01); *H01L 2224/04026* (2013.01); *H01L 2224/05009* (2013.01); *H01L 2224/05018* (2013.01); *H01L 2224/05073* (2013.01); *H01L 2224/05082* (2013.01); *H01L 2224/0589* (2013.01); *H01L 2224/05124* (2013.01); *H01L 2224/05139* (2013.01); *H01L 2224/05144* (2013.01); *H01L 2224/05147* (2013.01); *H01L 2224/05166* (2013.01); *H01L 2224/05551* (2013.01); *H01L 2224/05558* (2013.01); *H01L 2224/05559* (2013.01); *H01L 2224/05624* (2013.01); *H01L 2224/05639* (2013.01); *H01L 2224/05644* (2013.01); *H01L 2224/05647* (2013.01); *H01L 2224/05666* (2013.01); *H01L 2224/05794* (2013.01); *H01L 2224/05839* (2013.01); *H01L 2224/05844* (2013.01); *H01L 2224/05847* (2013.01); *H01L 2224/05855* (2013.01); *H01L 2224/05864* (2013.01); *H01L 2224/05887* (2013.01); *H01L 2224/05893* (2013.01); *H01L 2224/2731* (2013.01); *H01L 2224/2732* (2013.01); *H01L 2224/27312* (2013.01); *H01L 2224/27436* (2013.01); *H01L 2224/27438* (2013.01); *H01L 2224/27505* (2013.01); *H01L 2224/291* (2013.01); *H01L 2224/293* (2013.01); *H01L 2224/29006* (2013.01); *H01L 2224/2908* (2013.01); *H01L 2224/29011* (2013.01); *H01L 2224/2912* (2013.01); *H01L 2224/29012* (2013.01); *H01L 2224/29017* (2013.01); *H01L 2224/2918* (2013.01); *H01L 2224/2919* (2013.01); *H01L 2224/2929* (2013.01); *H01L 2224/2939* (2013.01); *H01L 2224/29082* (2013.01); *H01L 2224/29083* (2013.01); *H01L 2224/29084* (2013.01); *H01L 2224/29101* (2013.01); *H01L 2224/29109* (2013.01); *H01L 2224/29111* (2013.01); *H01L 2224/29113* (2013.01); *H01L 2224/29116* (2013.01); *H01L 2224/29117* (2013.01); *H01L 2224/29118* (2013.01); *H01L 2224/29124* (2013.01); *H01L 2224/29138* (2013.01); *H01L 2224/29139* (2013.01); *H01L 2224/29144* (2013.01); *H01L 2224/29147* (2013.01); *H01L 2224/29184* (2013.01); *H01L 2224/29193* (2013.01); *H01L 2224/29294* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29387* (2013.01); *H01L 2224/29393* (2013.01); *H01L 2224/32245* (2013.01); *H01L 2224/48247* (2013.01); *H01L 2224/73265* (2013.01); *H01L 2224/741* (2013.01); *H01L 2224/8346* (2013.01); *H01L 2224/83191* (2013.01); *H01L 2224/83193* (2013.01); *H01L 2224/83444* (2013.01); *H01L 2224/83447* (2013.01); *H01L 2224/83455* (2013.01); *H01L 2224/83815* (2013.01); *H01L 2224/92* (2013.01); *H01L 2224/92247* (2013.01); *H01L 2224/94* (2013.01); *H01L 2924/00014* (2013.01); *H01L 2924/1033* (2013.01); *H01L 2924/10158* (2013.01); *H01L 2924/10253* (2013.01); *H01L 2924/10272* (2013.01); *H01L 2924/1421* (2013.01)

(56) References Cited

U.S. PATENT DOCUMENTS

| | | | |
|---|---|---|---|
| 7,799,634 | B2 | 9/2010 | Shen et al. |
| 7,985,649 | B1 | 7/2011 | Winstead et al. |
| 8,555,491 | B2 | 10/2013 | Boureghda et al. |
| 2008/0290399 | A1 | 11/2008 | Levy et al. |
| 2009/0020831 | A1 | 1/2009 | Ramkumar et al. |
| 2012/0086135 | A1* | 4/2012 | Thompson ............ H01L 23/13 257/787 |
| 2012/0268155 | A1* | 10/2012 | Rathburn ........... G01R 31/2889 324/756.02 |
| 2013/0105984 | A1* | 5/2013 | Rathburn ........... H01R 12/7076 257/773 |
| 2013/0154068 | A1 | 6/2013 | Sanchez et al. |
| 2014/0264383 | A1* | 9/2014 | Kajiwara ............ H01L 23/293 257/77 |
| 2015/0014865 | A1* | 1/2015 | Frueh .................. H01L 24/27 257/783 |
| 2015/0146399 | A1* | 5/2015 | Viswanathan ........ H01L 24/83 361/785 |

* cited by examiner

ELECTRONIC DEVICES WITH SEMICONDUCTOR DIE COUPLED TO A THERMALLY CONDUCTIVE SUBSTRATE

FIELD OF THE DISCLOSURE

This disclosure, in general, relates to die structures, devices made using such die structures, and methods for making such die structures and devices.

BACKGROUND

Semiconductor die are enclosed in a semiconductor package for protection from damage by external stresses and to carry electronic signals to and from the die. Such semiconductor packages generally include features that facilitate the dissipation of heat, such as flanges, heatsinks, and lead frames.

Many different types of semiconductor packages exist, including dual-in-line packages, pin and ball grid array packages, tape-automated bonding (TAB) packages, multichip modules (MCMs), and power packages. Packages used for high power semiconductor devices capable of dissipating greater than ten watts of power are referred to as power packages.

When integrating a semiconductor die into a package, including attaching such a semiconductor die to a lead frame, a flange, or a heatsink, the die is subjected to stresses, including thermal stresses that can result in cracking or otherwise altering the performance of components formed on the die. As such, an improved packaged semiconductor device and method of forming such a packaged semiconductor device, particularly high-powered semiconductor devices, would be desirable.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

In an exemplary embodiment, a semiconductor die is attached to a thermally conductive substrate. In an example, a sintered metallic layer lies between the semiconductor die and a conductive flow layer, such as a solder layer, and the conductive flow layer lies between the sintered layer and the thermally conductive substrate to attach the sintered metallic layer and semiconductor die to the thermally conductive substrate. The semiconductor die can include electronic components formed within a base semiconductor substrate material comprising gallium, silicon, and the like. The semiconductor die can include vias lined or filled with conductive metals. For example, the vias may be through substrate vias (TSVs), which extend through an entire thickness of the semiconductor substrate. Alternatively, the vias may extend only partially through the substrate. In an example, the sintered metallic layer includes sintered silver and is in direct contact with a lower surface of the semiconductor die (also referred to herein as a backside or backside surface). In an example, a conductive flow layer is in direct contact with the sintered metallic layer. In another example, an interposer can be applied between the conductive flow layer and the sintered metallic layer. The interposer can be formed of thermally conductive materials in one or more layers. The conductive flow layer can be formed of a solder material or can be formed of a thermally conductive polymeric material, such as a thermally conductive epoxy. In particular, the solder material can have a melting point in a range of about 210° C. and about 380° C. The thermally conductive substrate can be a flange, a heatsink, or a lead frame. In particular, a thermally conductive substrate can be formed of a conductive metal, such as copper. In a particular example, a thermally conductive substrate can be a copper substrate free of plating.

An exemplary electronic device can be formed by applying a sinterable metallic material to a wafer comprising a plurality of die locations, sintering the sinterable metallic material while on the wafer, and singulating the wafer into a plurality of die. Alternatively, the sinterable metallic material can be applied to individual die, followed by sintering. Optionally, an interposer can be applied over the sintered metallic layer prior to singulating or can be applied on a singulated die. The die including the sintered metallic layer can then be attached to a thermally conductive substrate using a thermally conductive flow layer.

The thermally conductive flow layer includes a thermally conductive material that during the process of attaching the semiconductor die to the thermally conductive substrate can take the form of a flowable material that hardens. The thermally conductive flow layer can include a conductive polymer composition or a metallic solder. In particular, the thermally conductive flow layer can include a solder. Following attachment of the die to the thermally conductive substrate, the work piece including the semiconductor die can be packaged. For example, connections with circuitry of the semiconductor die can be formed, such as through wire bonding, and the work piece can be encapsulated or contained in an air cavity package.

Figure 1:
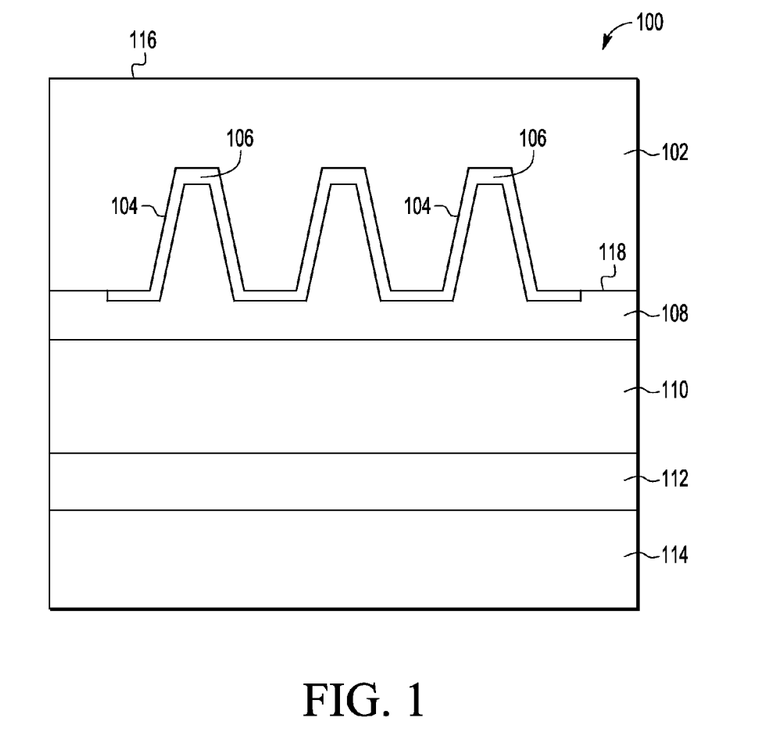
FIG. 1 includes an illustration of an exemplary semiconductor device.

As illustrated in FIG. 1, a portion of an electronic device 100 is depicted, where the electronic device 100 can include a semiconductor die 102 having a top surface 116 and lower surface 118, a thermally conductive substrate 114, and a plurality of layers 108, 110, 112 that couple the semiconductor die 102 to the substrate 114. Note that the relative thicknesses of the die 102, layers 108, 110, 112, and substrate 114 may be significantly different from the thicknesses depicted in FIG. 1.

The semiconductor die 102 is formed of a semiconductor material, such as silicon, silicon carbide, silicon-on-insulator, silicon-on-sapphire, gallium nitride, gallium arsenide, the like, or a combination thereof. In a further example, the semiconductor material can be silicon based, gallium nitride on silicon, gallium nitride on silicon carbide, gallium nitride on diamond, a silicon carbide semiconductor, a diamond semiconductor, or any combination thereof. In a particular example, the semiconductor material includes gallium nitride. In another example, the semiconductor material includes silicon or includes silicon carbide.

Electronic components can be formed comprising the semiconductor material. In a particular example, the electronic components are formed at layers proximal to the top surface 116 and can include contacts (not shown) on the top surface 116 that provide access external the semiconductor die. Alternatively, electronic components of the semiconductor die can be accessed by through substrate vias (TSVs) that are exposed at on the lower surface 118, or are connected to other contacts at the lower surface. In an alternative example, the electronic components are formed within layers proximal to the lower surface 118 and can include contacts exposed on the lower surface 118.

The semiconductor die 102 can have a thickness in a range of about 10 microns (μm) to about 500 μm, such as a range of about 10 μm to about 300 μm. In a particular example, the semiconductor die is a thin semiconductor die having a thickness in a range of about 10 μm to about 50 μm, such as a range of about 15 μm to about 40 μm, or a range of about 15 μm to about 30 μm. In another example, the semiconductor die 102 can have a thickness in a range of about 50 μm to about 200 μm, such as a range of about 75 μm to about 125 μm.

In an example, the semiconductor die 102 can include vias 104 (e.g., TSVs or vias that do not extend all the way through the die). Such vias 104 can be lined or filled with one or more metallic layers 106. Such vias 104 can perform one or more functions, including to provide improved heat transfer from the semiconductor material, provide for an electrical connection for a common ground, or provide an electrical connection for individual interconnect access, the like, or combinations thereof. In a particular example, the vias 104 provide at least for enhanced transfer of thermally energy from the semiconductor material. Alternatively, the semiconductor die 102 can be without vias.

The vias 104 can include one or more metallic layers 106 formed of one or more metals. Such metallic layers can include metals such as gold, silver, titanium, copper, aluminum, or any combination thereof. In a particular example, the one or more metallic layers 106 include gold.

The sintered metallic layer 108 underlies the lower surface 118 of the semiconductor die 102. For example, the sintered metallic layer 108 may be formed directly on the lower surface 118 of the semiconductor die 102 and/or on the metallic layers 106. In a particular example, the sintered metallic layer 108 can be in direct contact with all or some of the lower surface 118 of the semiconductor die 102. In an example, the sintered metallic layer 108 is applied fully to the lower surface 118 of the semiconductor die 102. In another example, the sintered material 108 is applied to part of the lower surface 118, such as in a pattern, for example, to contact particular vias 104. The sintered metallic layer can be formed from a sinterable material including particulate metal and optionally including flux, polymer binders, distributors, and thinners. The particulate metal can have a particle size in a range of about 10 nanometers (nm) to about 100 μm, such as a range of about 100 nm to about 50 μm or a range of about 1 μm to about 20 μm. In response to sintering, the particles of the sintered metallic layer 108 and the semiconductor die 102 bind to each other to form a solid structure. In particular, materials of the sinterable material diffuse across the boundaries of the particles, fusing the particles together and creating one solid piece. The sinterable material can be provided in the form of a film or of a paste. In an example, the sintered metallic layer 108 includes a metal, such as silver, gold, palladium, copper, nickel, or combinations thereof. In a particular example, the sintered metallic layer 108 includes silver. The sinterable material may also include non-metallic particulate, such as diamond, silicon carbide, boron nitride, or combinations thereof.

The sintered metallic layer 108 can have a thickness in a range of about 10 μm to about 200 μm. For example, the sintered metallic layer can have a thickness in a range of about 10 μm to about 150 μm, such as a thickness in a range of about 10 μm to about 50 μm. The sintered metallic layer 108 can have desirable density, for example, in a range of about 40% to about 95%, expressed as a percentage relative to the density of the sold constituent metal. For example, the sintered metallic layer can have a density in a range of about 65% to about 95%, such as a density in a range of about 65% to about 85%. Further, the sintered metallic layer 108 can have a desirable modulus, for example, in a range of about 5 gigapascals (GPa) to about 25 GPa. For example, the modulus can be in a range of about 5 GPa to about 15 GPa, such as a range of about 7 GPa to about 15 GPa. In a further example, the sintered metallic layer 108 has a desirable coefficient of thermal expansion (CTE), such as in a range of about 4 parts per million per degrees Celsius (ppm/° C.) to about 20 ppm/° C. For example, sintered metallic layer 108 can have a CTE in a range of about 10 ppm/° C. to about 20 ppm/° C., such as in a range of about 15 ppm/° C. to about 20 ppm/° C.

Optionally, an interposer 110 is disposed between the sintered metallic layer 108 and a conductive flow layer 112. Alternatively, the electronic device 100 can be free of the interposer 110. In the illustrated example, the interposer 110 is in direct contact with the sintered metallic layer 108. The interposer 110 can include one or more layers formed of materials, such as copper, diamond, silver, aluminum, molybdenum, tungsten, or a combination thereof. In an example, the interposer 110 is formed of a film or foil. In another example, the interposer 110 can be in the form of a mesh screen. Exemplary interposers 110 include copper, copper-molybdenum, copper-molybdenum-copper, copper-diamond, aluminum-diamond, copper-tungsten, silver-diamond, or aluminum-silver interposers, or any combination thereof. The interposer 110 can be plated or unplated. The interposer 110 can have a thickness in a range of about 10 μm to about 350 μm. For example, the thickness can be in a range of about 10 μm to about 250 μm or a range of about 25 μm to about 75 μm.

Figure 15:
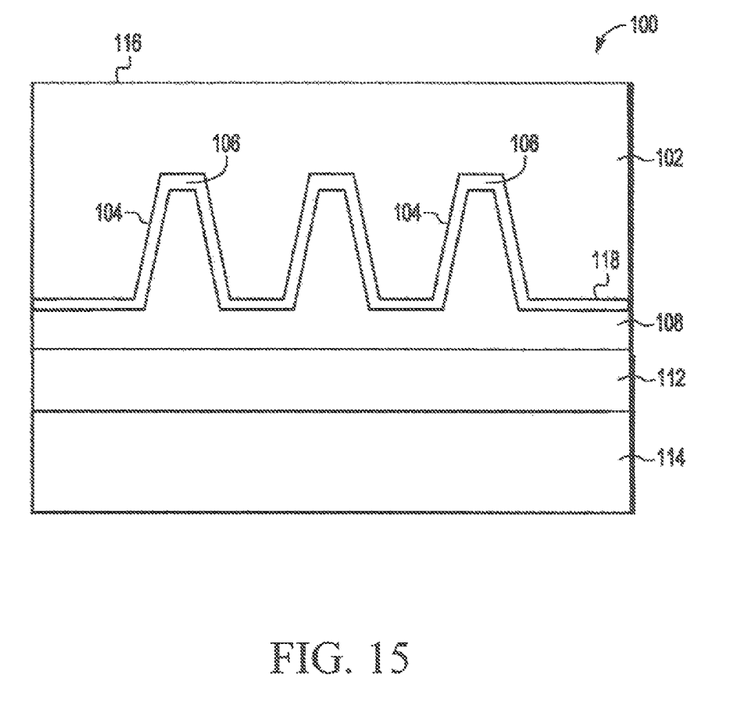
FIG. 15 includes an illustration of another embodiment of an exemplary semiconductor device.

The conductive flow layer 112 underlies the sintered metallic layer 108 and optionally the interposer 110. In an example in which the interposer 110 is excluded, such as is illustrated in FIG. 15, or has openings (e.g., when the interposer 110 has a mesh screen structure), the conductive flow layer 112 is in direct contact with the sintered metallic layer 108. As illustrated, the conductive flow layer 112 is in direct contact with the optional interposer 110.

The conductive flow layer 112 includes a thermally conductive material that during the process of attaching the semiconductor die 102 to the thermally conductive substrate 114 can take the form of a flowable material that hardens. For example, the thermally conductive flow layer 112 can be formed of a polymeric material, such as a thermally conductive epoxy, that hardens. In another example, the thermally conductive flow layer 112 can be formed of a solder material that is melted during the process of attaching the semiconductor die 102 to the thermally conductive substrate 114. In a particular example, the thermally conductive flow layer 112 is formed of a solder material having a melting point in a range of about 110° C. to about 380° C., such as about 150° C. to about 380° C. For example, the solder material can have a melting point in the range of about 200° C. to about 310° C., such as a melting point in a range of about 215° C. to about 290° C. In an alternative example, the solder material can have a melting point in a range of about 260° C. to about 380° C. An exemplary solder includes an alloy or amalgam of metals or semi-metals, such as lead, tin, gold, silver, copper, zinc, antimony, gold, phosphorus, bismuth, indium, cadmium, aluminum, silicon, germanium, or any combination thereof. In an example, the solder material can be a lead free solder, such as a gold-silicon solder or a gold-tin solder. In another example, the solder can include a lead-tin-silver solder.

The conductive flow layer 112 can have a thickness in a range of about 10 µm to about 50 µm. For example, the thickness of the conductive flow layer 112 can be in a range of about 15 µm to about 40 µm, such as a range of about 15 µm to about 30 µm. The conductive flow layer 112 can be applied to the full surface underlying the sintered layer 108 or optionally, the interposer 110. In another example, the conductive flow layer 112 can be applied to a part of the surface, such as in a pattern.

The thermally conductive substrate 114 (only a portion of which is shown in FIG. 1) can include a thermal heat sink. In an example, the substrate 114 can include a flange or can be a portion of a lead frame. In a particular example, the substrate 114 is a flange or lead frame formed of copper, iron nickel alloy, nickel cobalt iron alloy, or a combination thereof. In particular, the flange or lead frame can be copper. The copper flange or lead frame can be free of plating. Alternatively, the flange or lead frame can have plating on its surface, such as gold plating or NiPdAu plating. The thermally conductive substrate 114 can have a thickness in a range of about 100 µm to about 2500 µm, such as a range of about 100 µm to about 1000 µm, or a range of about 100 µm to about 500 µm.

Figures 2, 3, 4:
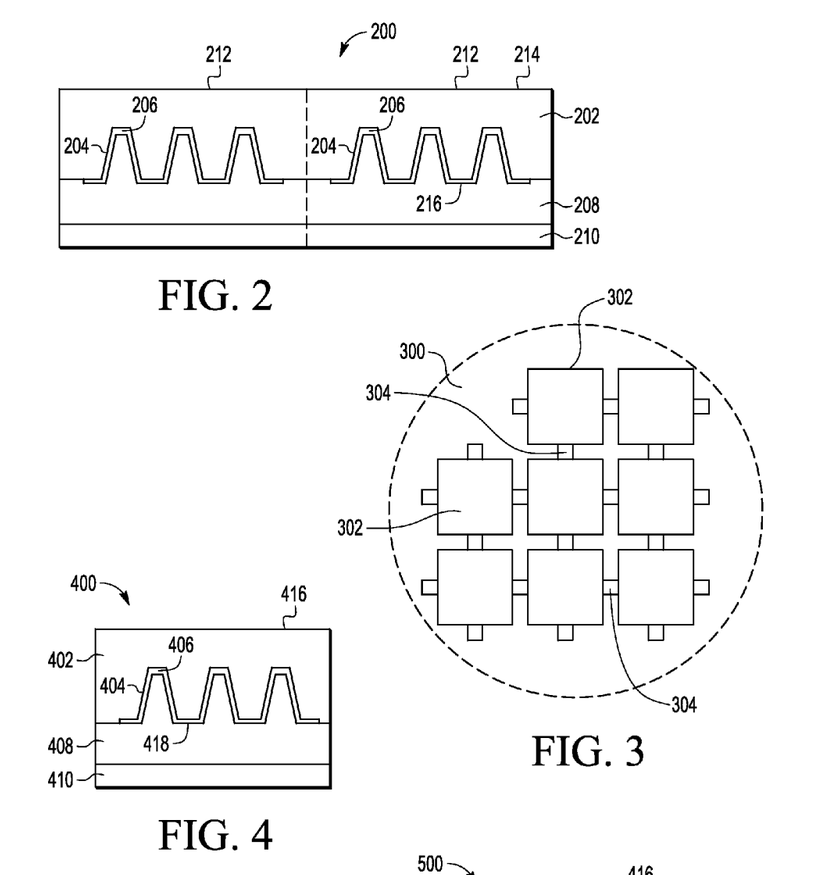
FIG. 2 includes an illustration of an exemplary wafer including a plurality of die.
FIG. 3 includes an illustration of an exemplary interposer film.
FIG. 4 and FIG. 5 include illustrations of exemplary work pieces including a semiconductor die.

An electronic device can be formed by applying a sintered metallic layer at the wafer level or by applying the sintered metallic layer following singulating the wafer into a plurality of die 212. For example, as illustrated at FIG. 2, a semiconductor wafer 200 includes a plurality of die 212 in the form of a semiconductor material layer 202. Electronic components or circuitry can be formed within the semiconductor material layer 202. For example, the electronic components can be formed proximal to a top surface 214 of the semiconductor material 202 and can include contacts exposed at the top surface 214. In an alternative example, electronic components and circuitry can be accessed by vias. Alternatively, the electronic components or circuitry can be formed proximal to a lower surface 216 of the semiconductor material 202.

Optionally, vias 204 can be formed within the semiconductor material 202, and such vias 204 can be lined or filled with one or more metallic layers 206. The vias 204 can act to dissipate thermal energy from the semiconductor material 202, provide a common ground to circuitry formed within the semiconductor material 202, or provide for interconnects for electronic access to the electronic components and circuitry formed within the semiconductor material 202, or any combination thereof. In a particular example, the vias 204 provide for the transfer of thermal energy from the semiconductor material 202.

One or more metallic layers 206 can be formed within the vias 204. For example, the one or more metallic layers 206 can be formed of metals, as described above. In a particular example, a layer of titanium is deposited, followed by layers of gold. The layers can be deposited by sputtering, plating, or a combination thereof. In an alternative example, such one or more metallic layers can be formed over a backside surface of the substrate 202 absent vias.

A sinterable material can be applied to form the sintered metallic layer 208. As illustrated, the sintered metallic layer 208 can be formed in contact with the lower surface 216 of the semiconductor material layer 202 and optional metallic layers 206. The sintered metallic layer 208 may or may not extend into the vias 204. The sintered metallic layer 208 can cover the lower surface 216. Alternatively, the sintered metallic layer 208 can be applied to part of the surface 216, such as in a pattern. The sinterable material can be applied as a film or as a paste. In an example, a precut film including the sinterable material is applied to the lower layer 216 of the semiconductor material 202. In another example, a paste can be applied to the lower surface 206. For example, the paste can be applied using stencil printing or other similar techniques. Once applied, the sinterable material can be sintered while the wafer is intact (i.e., prior to singulation of the die). Alternatively, the sinterable material can be sintered following singulation. In an example, the sintered material may not be included at scribe lines (not shown) to facilitate singulation. In a further example, the sintered material may not be included over all of the vias 204 to facilitate communicating data signals through one or more of the vias 204.

Optionally, an interposer 210 can be applied over the sintered metallic layer 208. The interposer can be applied prior to sintering the sintered metallic layer 208 or following sintering the sintered metallic layer 208. The interposer 210 can be formed of metals in one or more layers, as described above. In a particular example, when an interposer 210 is applied to the wafer, the interposer 210 can be applied as a precut film or can be formed using structures that provide less resistance to singulation. For example, as illustrated in FIG. 3 in bottom plan view, an interposer film 300 can be formed to include tie bars 304 between interposer die structures 302 (where a distinct interposer die structure 302 underlies each individual die, and the tie bars 304 interconnect the die structures 302 across the saw streets) to allow easier singulation of the wafer into individual die. In another example, the interposer 210 can be a mesh screen, such as a tungsten or molybdenum mesh screen. In such an example, the sinterable silver composition can extend through the mesh to form an interconnected or percolated skeleton.

Alternatively, the sintered material layer can be applied to a singulated die. For example, as illustrated at FIG. 4, a work piece 400 includes a semiconductor die 402 having an upper surface 416 and a lower surface 418. As above, the semiconductor material 402 can include electronic components and circuitry formed within the semiconductor material 402. Example semiconductor materials are described above. Optionally, vias 404 can be formed in the semiconductor material 402 and can be lined or filled with one or more metallic layers 406. A sintered metallic layer 408 can be applied to and in direct contact with the lower surface 418 of the semiconductor material 402 and optional metallic layers 406 formed within the vias 404. The sintered metallic layer 408 can be applied as a film or a paste formed of a sinterable material, such as described above. Optionally, an interposer 410 can be applied in precut form to the die. Exemplary interposer materials include those described above.

Figure 5:
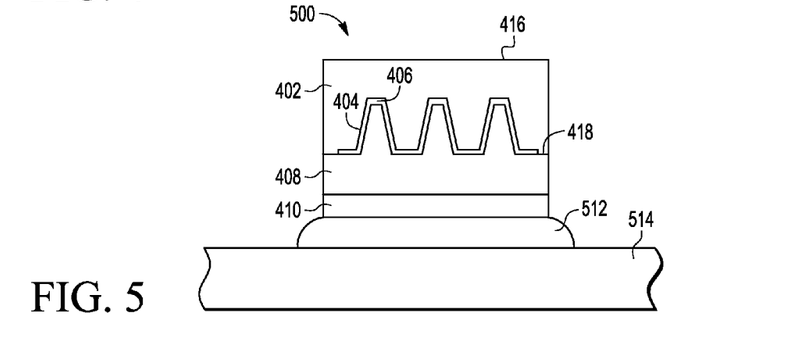

Whether formed as part of a wafer or applied to die, the sintered material layer and optional interposer can be attached to a thermally conductive substrate using a thermally conductive flow material. The thermally conductive flow material can be applied to the full surface of the die or can be applied to part of the surface, for example, in a pattern. For example, as illustrated in FIG. 5, a work piece includes the semiconductor material layer 402, optionally including vias 404 and one or more metallic layers 406, attached to a sintered metallic layer 408 and optional interposer 410. A thermally conductive flow layer 512 couples the sintered metallic layer 408 and optional interposer 410 to the thermally conductive substrate 514. An exemplary thermally conductive flow material includes those described above. An exemplary thermally conductive substrate 514 includes those described above.

Figure 6:
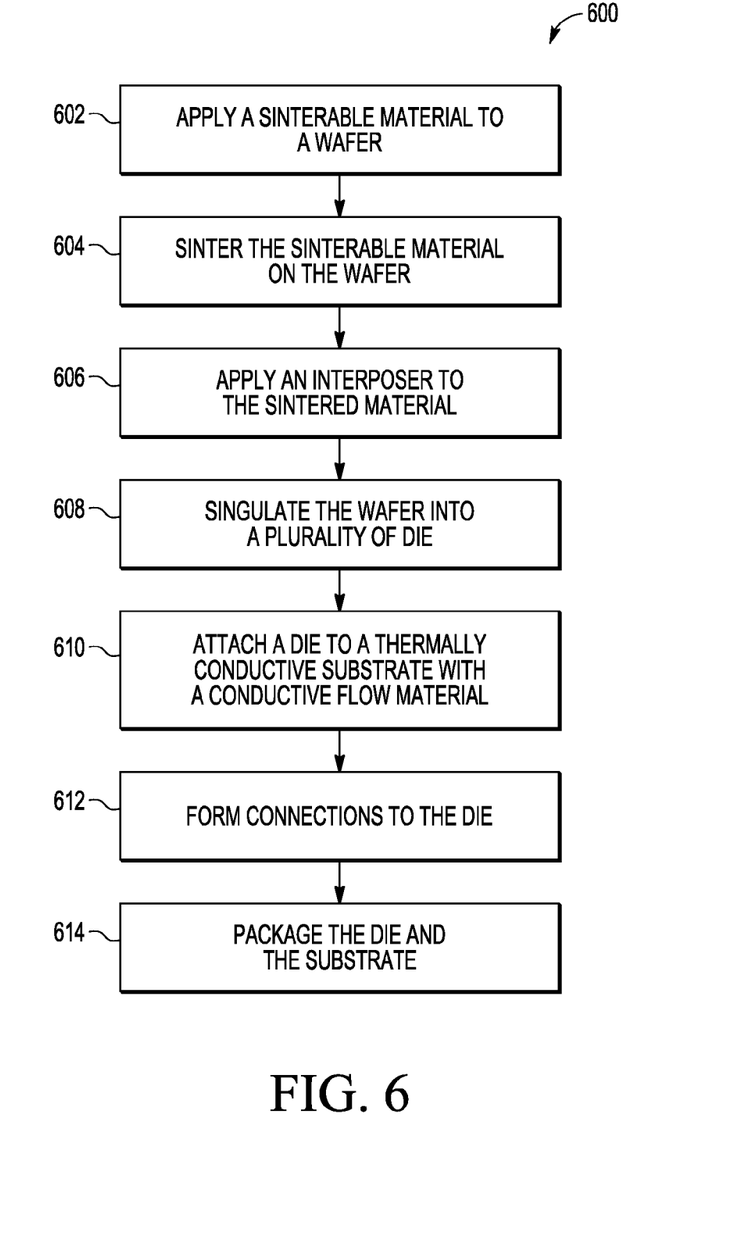
FIG. 6 and FIG. 7 include flow diagrams illustrating exemplary methods for forming an electronic device.

In a particular example, the sintered material layer can be applied over a wafer. For example, a wafer including die circuitry can be secured to a carrier with the backside (or lower surface) of the wafer facing upward. The backside of the wafer can be ground or etched to reduce the wafer thickness or reduce stress within the wafer. As illustrated in FIG. 6, a method 600 includes applying a sinterable material to a wafer, as illustrated at 602. The wafer can be thinned or lapped prior to application of the sinterable material. In an example, the sinterable material can be in the form of a film that is laminated to the backside of the wafer. In particular, the film can be laminated to the backside of the wafer using a pressure in a range of about 0.5 megapascals (MPa) to 5 about MPa, such as a pressure range of about 0.5 MPa to about 3 MPa or a pressure in a range of about 1 MPa to about 2 MPa. The film can be laminated to the backside of the wafer at a temperature in a range of about 90° C. to about 180° C., such as a temperature in a range of about 110° C. to about 170° C. or in a range of about 120° C. to about 150° C. The temperature and optionally pressure can be applied for a period in the range of about 15 seconds to about 5 minutes, such as a period in a range of about 30 seconds to about 3 minutes, or a range of about 1 minute to about 2 minutes. In another example, the sinterable material can be applied as a paste. For example, the sinterable material can be screen printed or stencil printed onto the backside of the wafer.

As illustrated at 604, the sinterable material can be sintered into a sintered metallic layer. For example, the sinterable material can be sintered at a temperature in a range of about 180° C. to about 300° C., such as a temperature in a range of about 200° C. to about 280° C., or a temperature range of about 220° C. to about 280° C. Optionally, the sinterable material can be pressed during sintering process. For example, a pressure in a range of about 1 MPa to about 25 MPa, such as in a range of about 5 MPa to about 20 MPa or a range of about 4 MPa to about 10 MPa, can be applied while sintering the sinterable material. In particular, sintering can be performed for a period in a range of about 30 seconds to about 10 minutes, such as a period in a range of about 1 minute to about 6 minutes or a range of about 3 minutes to about 4 minutes. In an example, sintering can be performed in a heated press.

Optionally, an interposer can be applied to the sintered material layer, as illustrated at 606. The interposer can be applied prior to sintering. Alternatively, the interposer can be laminated to the sintered material layer following sintering. Exemplary interposers are described above.

As illustrated at 608, the wafer can be singulated into individual die. In particular, the wafer can be diced or sawed to form individual die, each die including a sintered material layer proximal to a backside surface.

As illustrated at 610, the individual die can be attached to a thermally conductive substrate. In particular, a conductive flow material can be applied between the sintered material layer of the individual die and the substrate. Exemplary conductive flow materials are described above. In particular, the conductive flow material is a solder material, and attaching the sintered material layer to the substrate includes soldering the die to the substrate by, for example, melting the solder, contacting the solder with the sintered material layer and the substrate, and hardening the solder. In an example, the solder can be applied as a melted wired solder to the substrate, and the individual die can be applied to the substrate when the solder is in a melted form. In another example, the solder can be applied as a paste to the sintered material layer of the die, the die can be applied to the substrate, and the paste can be melted to form a melted solder flow layer between the sintered material layer and the thermally conductive substrate. In a particular example, solder can be melted at a temperature range of about 100° C. and about 308° C., such as a temperature in a range of about 200° C. to about 300° C. or a range of about 215° C. to about 290° C. Alternatively, the solder can be melted at a temperature in a range of about 260° C. to about 300° C. The solder can then cool and harden, securing the die and sintered material layer to the thermally conductive substrate.

Following attachment to the substrate, the work piece including the semiconductor die and the thermally conductive substrate can be packaged. Connections, for example, through wire bonding, can be formed, as illustrated at 612. The structure can be encapsulated or enclosed in an air cavity package, as illustrated at 614. For example, protective coatings and polymeric packaging can be used to encapsulate the work piece, leaving access to interconnects.

In a particular example illustrated in FIG. 8-FIG. 14, a wafer 802 including a plurality of die 810 forming portions of the wafer 802 is secured to a support 808 using an adhesive 804 and a release layer 806. In an example, the support 808 can include a carrier, such as a glass carrier. The adhesive 804 can, for example, be a curable adhesive, such as a UV curable adhesive. The release layer 806 can be a light to heat conversion coating that releases upon exposure to light.

Figure 9:
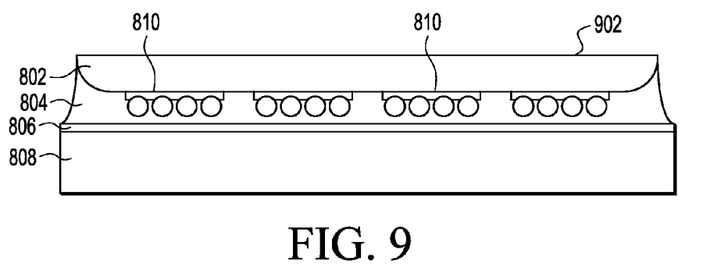

As illustrated in FIG. 9, the wafer backside 902 can be ground or etched. In an example, the backside surface 902 of the wafer 802 is ground to reduce the thickness of the wafer 802. The backside surface 902 can also be etched to remove backside stress or prepare for a back metal adhesion. Optionally, washing steps can be applied before or after grinding or before or after wet etching.

Figure 10:
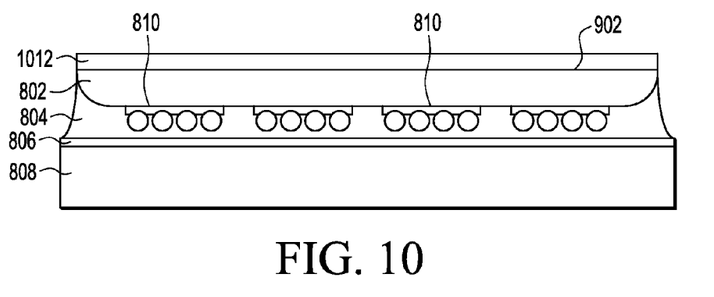

As illustrated in FIG. 10, a metallic layer 1012 can optionally be applied to the backside 902 of the wafer 802. In an example, the metal can be sputtered to form the metallic layer 1012. An exemplary metal includes gold, silver, titanium, copper, aluminum, or any combination thereof. In a particular example, the metal includes gold.

Figure 11:
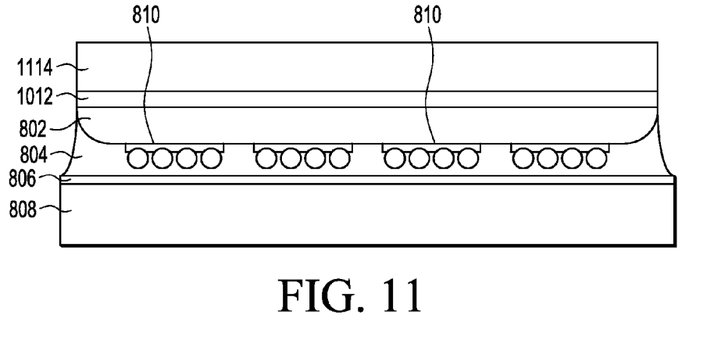

As illustrated in FIG. 11, a sinterable layer 1114 can be applied over the metallic layer 1012. In an example, the sinterable layer 1114 can be a sinterable film that is laminated to the metallic layer 1012. Alternatively, the sinterable layer 1114 can be applied as a paste that is coated over the metal layer 1012. In another example, a sinterable material can be printed over the metal layer 1012. In a further example, a sinterable material can be dispensed over the metal layer 1012. The sinterable layer 1114 can be applied to full surface of the metal layer 1012. Alternatively, the sinterable layer 1114 can be applied to part of the metal layer 1012, such as in a pattern. The sinterable film or paste can include silver, gold, palladium, copper, nickel, and combinations thereof. Optionally, the sinterable material can include a flux material, such as a resin. In another example, the sinterable material includes 0 vol % to 20 vol % of a polymer, such as 0.01 vol % to 20 vol %. In an example, the polymer can be a thermosetting polymer. In a particular example, the sinterable film is a silver sinterable film.

Figure 12:
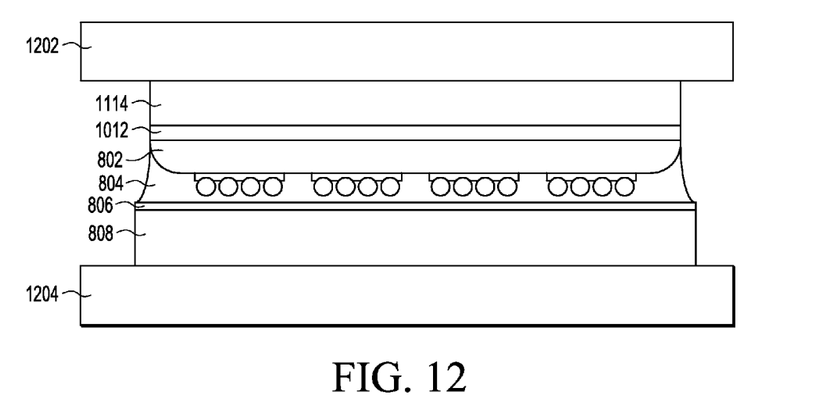

The sinterable layer 1114 can be sintered, for example, by heating and optionally applying pressure. As illustrated in FIG. 12, the wafer 802, metallic layer 1012, and sinterable layer 1114 can be applied between two platens 1202 and 1204. The platens 1202 and 1204 can be heated and can optionally apply pressure to the sinterable layer 1114.

In a particular example, the sinterable material can be sintered at a temperature in a range of about 180° C. to about 300° C., such as a temperature in a range of about 200° C. to about 280° C., or a temperature range of about 220° C. to about 280° C. Optionally, the sinterable material can be pressed during sintering process. For example, a pressure in a range of about 1 MPa to about 25 MPa, such as in a range of about 5 MPa to about 20 MPa or a range of about 4 MPa to about 10 MPa, can be applied while sintering the sinterable material. In particular, sintering can be performed for a period in a range of about 30 seconds to about 10 minutes, such as a period in a range of about 1 minute to about 6 minutes or a range of about 3 minutes to about 4 minutes.

Figure 13:
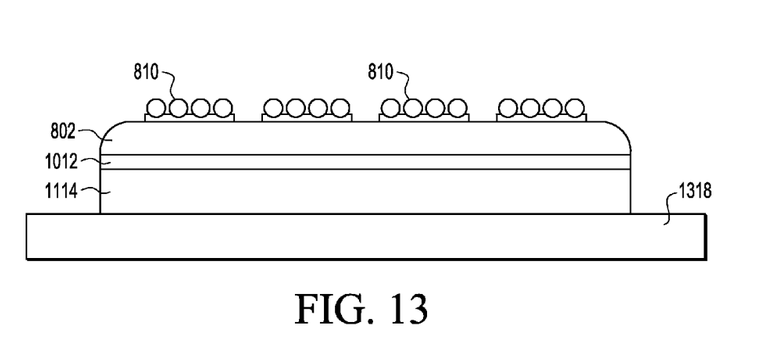

The sintered layer 1114 can be applied to a tape, such as a dicing tape 1318 (FIG. 13). The wafer 802 and the attached metallic layer 1012 and sintered layer 1114 can be separated from the support 808. When the release layer 806 is a light to heat conversion coating, a laser, such as a YAG laser, can be used to separate the support 808 from the release layer 806. The release layer 806 and the adhesive layer 804 can then be peeled from the surface of the wafer 802 to reveal the circuitry of the die 810. As illustrated in FIG. 13, the wafer 802 including die circuitry 810 includes the backside metallic layer 1012 and the sintered layer 1114. The sintered layer 1114 is attached to the dicing tape 1318.

Figure 14:
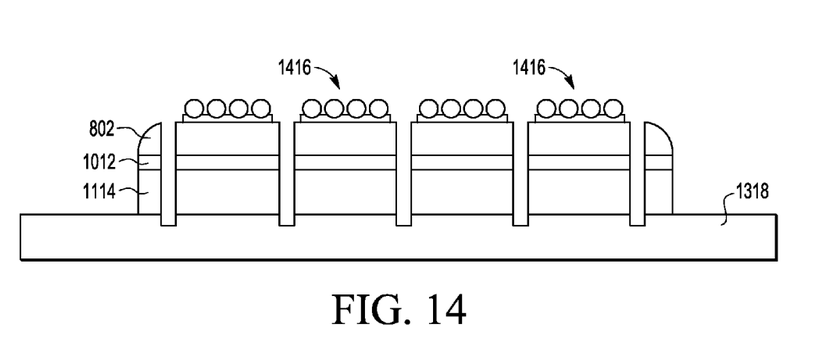

As illustrated in FIG. 14, the wafer can be diced, providing singulated die 1416, each of which includes a semiconductor substrate 802, the metallic layer 1012 on the backside of the substrate 802, and the sintered layer 1114 in contact with the metallic layer 1012 and secured to the dicing tape 1318. The singulated die 1416 can be removed from the dicing tape, and can be secured to a frame or flange as described above.

Figure 7:
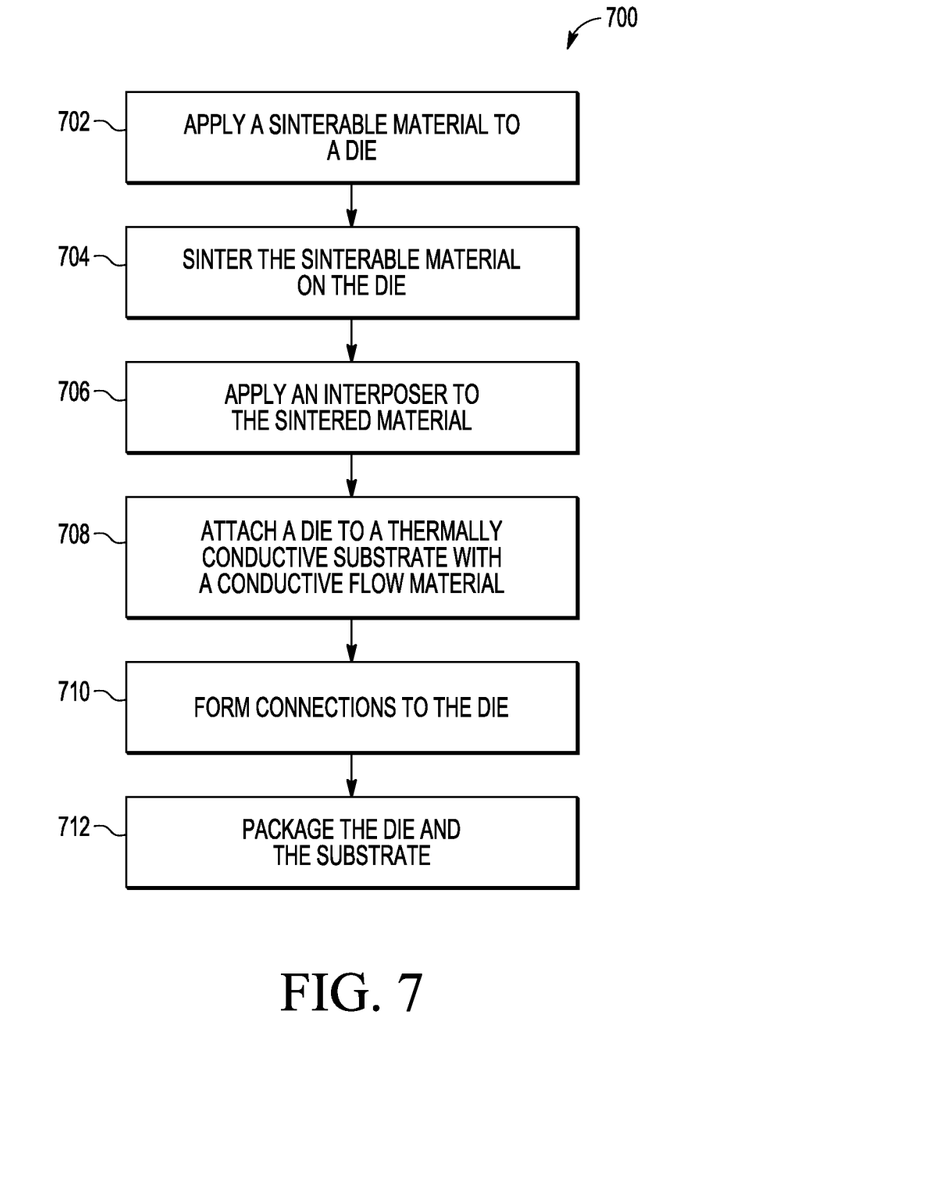
Figure 8:
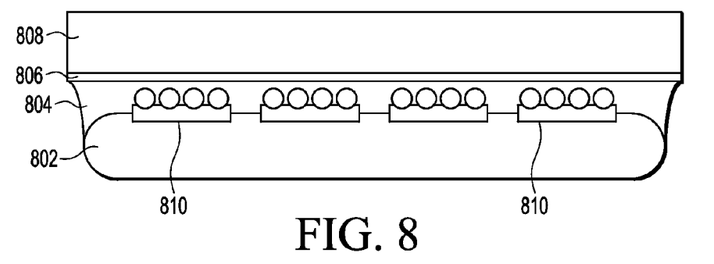
FIG. 8, FIG. 9, FIG. 10, FIG. 11, FIG. 12, FIG. 13, and FIG. 14 include illustrations of exemplary work pieces including semiconductor die.

In an alternative example, the sinterable material can be applied to a singulated in die. For example, as illustrated at FIG. 7, a method 700 includes applying a sinterable material to a backside surface of an individual die after singulation, as illustrated at 702. In a particular example, sinterable material can be in the form of a film that can be laminated to the backside (or bottom surface) of the die. The film can be laminated to the full surface or the film can apply a pattern of sinterable material. In particular, the film can be laminated to the backside of the die using a pressure in a range of about 0.5 MPa to about 5 MPa, such as a pressure range of about 0.5 MPa to about 3 MPa or a pressure in a range of about 1 MPa to about 2 MPa. The film can be laminated to the backside of the die at a temperature in a range of about 90° C. to about 180° C., such as in a range of about 110° C. to about 170° C. or in a range of about 120° C. to about 150° C. The temperature and optionally pressure can be applied for a period in the range of about 15 seconds to about 5 minutes, such as a period in a range of about 30 seconds to about 3 minutes, or a range of about 1 minute to about 2 minutes. In another example, the sinterable material can be applied as a paste. For example, the sinterable material can be screen printed, stencil printed, or extruded onto the backside of the die.

The sintered material can be sintered, as illustrated at 704. For example, the sinterable material can be sintered at a temperature in a range of about 180° C. to about 300° C., such as a temperature in a range of about 180° C. to about 270° C., or in a range of about 200° C. to about 250° C. Optionally, the sinterable material can be pressed during sintering process. For example, a pressure in a range of about 1 MPa to about 25 MPa, such as in a range of about 5 MPa to about 20 MPa or a range of about 4 MPa to about 10 MPa, can be applied while sintering the sinterable material. In particular, sintering can be performed for a period in a range of about 30 seconds to about 10 minutes, such as a period in a range of about 1 minute to about 6 minutes or a range of about 3 minutes to about 4 minutes. In an example, sintering can be performed in a heated press.

As illustrated at 706, an interposer can optionally be laminated to the sintered material layer. Exemplary interposers are described above. The interposer can be applied prior to sintering. Alternatively, the interposer can be applied after sintering.

As illustrated at 708, individual die including the sintered metallic layer can be attached to a thermally conductive substrate using a conductive flow layer. An exemplary thermally conductive flow material is described above. The conductive flow layer can be applied to the full surface of the sintered metallic layer or optional interposer. Alternatively, the conductive flow layer can be applied to part of the surface, such as in a pattern. In particular, the conductive flow material is a solder material, and attaching the sintered material layer to the substrate includes soldering the die to the substrate by, for example, melting the solder, contacting the solder with the sintered material layer and the substrate, and hardening the solder. In an example, the solder can be applied as a melted wired solder to the substrate, and the individual die can be applied to the substrate when the solder is in a melted form. In another example, the solder can be applied as a paste to the sintered material layer of the die, the die can be applied to the substrate, and the paste can be melted to form a melted solder flow layer between the sintered material layer and the thermally conductive substrate. In a particular example, the solder can be melted at a temperature range of about 100° C. to about 308° C., such as a temperature in a range of about 200° C. to about 300° C. or a range of about 215° C. to about 290° C. Alternatively, the solder can be melted at a temperature in a range of about 260° C. to about 300° C. The solder can then cool and harden, securing the die and sintered material layer to the thermally conductive substrate.

As illustrated at 710, connections, such as through wire bonding or other interconnect technologies, can be formed, and the device can be encapsulated or enclosed in an air cavity package, as illustrated at 712, to form an electronic device.

In an example, the circuitry on the individual die in the embodiments described above and the resulting packaged device can include radio frequency circuitry and can be configured to operate at radio frequencies in a range of about 3 kilohertz (kHz) to about 100 gigahertz (GHz), such as a range of about 200 megahertz (MHz) to about 3.5 GHz. In an embodiment, the radio frequency circuitry includes a signal amplifier comprising one or more transistors that amplifies a radio frequency signal. In other embodiments, the device operates at about 3 kHz to about 10 GHz.

Embodiments of the electronic device and methods for forming such electronic devices provide particular technical advantages including increased reliability and greater production yield. For example, gallium nitride semiconductor materials can be reliably attached to copper flanges using the sintered metallic layer and solder layers described above, despite large differences in coefficient of thermal expansion. In particular, higher temperature lead-based solder can be used to couple such semiconductor materials to copper flanges or lead frames, particularly those that lack plating, with higher yield. Similarly, thin silicon die can be applied to flanges and lead frames with greater reliability using the proposed methods and structures, providing higher yield. The sintered metallic layer can yield a more uniform surface despite curvature of thin silicon die and reduce mechanical stresses on such thin silicon die when securing such die to flanges and heatsinks.

In a first aspect, an electronic device includes a thermally conductive substrate; a semiconductor die disposed over the thermally conductive substrate and having a plurality of major surfaces including an upper surface and a lower surface; a sintered metallic layer disposed between the lower surface of the semiconductor die and the thermally conductive substrate; and a thermally conductive flow layer disposed between the sintered metallic layer and coupling the sintered metallic layer and the semiconductor die to the thermally conductive substrate.

In a second aspect, an electronic device includes a semiconductor die comprising gallium nitride and having a surface exposing vias including a conductive material; a sintered silver layer underlying the semiconductor die and in direct contact with the conductive material; a solder layer underlying and in direct contact with the sintered metallic layer, the solder layer a melting point in a range of 210° C. and 310° C.; and a copper lead frame underlying and in direct contact with the solder layer, the copper lead frame free of plating.

In a third aspect, an electronic device includes a semiconductor die comprising silicon or silicon carbide and having a thickness in a range of 10 µm to 50 µm; a sintered silver layer underlying the semiconductor die and in direct contact with the conductive material; a solder layer underlying and in direct contact with the sintered metallic layer, the solder layer a melting point in a range of 210° C. and 310° C.; and a copper lead frame underlying and in direct contact with the solder layer, the copper lead frame free of plating.

In an example of the first, second or third aspect, the semiconductor die comprises gallium nitride. In another example of the first aspect, the semiconductor die comprises silicon.

In a further example of the first, second or third aspect and the above examples, the semiconductor die comprises radio frequency circuitry.

In an additional example of the first, second or third aspect and the above examples, the semiconductor die has a thickness in a range of 10 µm to 50 µm. For example, the thickness is in a range of 15 µm to 40 µm. In another example, the thickness is in a range of 15 µm to 30 µm.

In another example of the first, second or third aspect and the above examples, the sintered metallic layer includes silver, gold, palladium, copper, nickel, or any combination thereof. For example, the sintered metallic layer further includes 0.01 vol % to 20 vol % of a polymer.

In a further example of the first, second or third aspect and the above examples, the sintered metallic layer has a thickness in a range of 10 µm to 200 µm. For example, the thickness is in a range of 10 µm to 150 µm. In another example, the thickness is in a range of 10 µm to 150 µm.

In an additional example of the first, second or third aspect and the above examples, the sintered metallic layer has a modulus in a range of 5 GPa to 25 GPa. For example, the modulus is in a range of 5 GPa to 15 GPa. In an example, the modulus is in a range of 7 GPa to 15 GPa.

In another example of the first, second or third aspect and the above examples, the sintered metallic layer has a density in a range of 40% to 95%. For example, the density is in a range of 65% to 95%. In an example, the density is in a range of 65% to 85%.

In a further example of the first, second or third aspect and the above examples, the semiconductor die includes a set of vias including metal. For example, the sintered metallic layer is in direct contact with the metal of the vias.

In an additional example of the first, second or third aspect and the above examples, the sintered metallic layer is in direct contact with the conductive flow layer.

In another example of the first, second or third aspect and the above examples, the conductive flow layer includes a conductive epoxy.

In a further example of the first, second or third aspect and the above examples, the conductive flow layer includes a solder. In an example, the solder includes lead, tin, gold, silver, copper, zinc, antimony, gold, phosphorus, bismuth, indium, cadmium, aluminum, silicon, germanium, or any combination thereof. In another example, the solder has a melting point in a range of 150° C. to 380° C. For example, the melting point is in a range of 200° C. to 310° C., such as a range of 215° C. to 290° C., or a range of 260° C. and 380° C.

In an additional example of the first, second or third aspect and the above examples, the conductive flow layer has a thickness in a range of 10 µm to 50 µm. For example, the thickness is in a range of 15 µm to 40 µm. In an example, the thickness is in a range of 15 µm to 30 µm.

In another example of the first, second or third aspect and the above examples, the substrate includes thermal sink.

In a further example of the first, second or third aspect and the above examples, the substrate includes a lead frame. For example, the lead frame is a copper lead frame. In an example, the copper lead frame is free of plating.

In an additional example of the first, second or third aspect and the above examples, the electronic device further includes an interposer disposed between the sintered metallic layer and the conductive flow layer. For example, the interposer is in direct contact with the sintered metallic layer. In an example, the interposer includes copper, diamond, silver, aluminum, molybdenum, tungsten, or a combination thereof. In a further example, the interposer has a layered structure including copper, copper-molybdenum, copper-molybdenum-copper, copper-diamond, aluminum-diamond, copper-tungsten, silver-diamond, or aluminum-silver interposers, or a combination thereof. In an example, the interposer has a thickness in a range of 10 µm to 350 µm. For example, the thickness is in a range of 10 µm to 250 µm, such as in a range of 25 µm to 75 µm.

In a fourth aspect, a method for forming an electronic device includes applying a sinterable material to a wafer comprising a plurality of die; sintering the sinterable material on the wafer; singulating the plurality of die from the wafer; and securing a die of the plurality of die to a thermally conductive substrate using a thermally conductive flow material.

In an example of the fourth aspect, sintering the sinterable material includes applying pressure to the sinterable material. For example, the pressure is in a range of 1 MPa to 25 MPa. In an example, the pressure is in a range of 5 MPa to 20 MPa.

In another example of the fourth aspect and the above examples, sintering includes sintering at a temperature in a range of 180° C. to 270° C. For example, the temperature is in a range of 200° C. to 250° C.

In a further example of the fourth aspect and the above examples, applying the sinterable material includes applying a sinter paste.

In an additional example of the fourth aspect and the above examples, applying the sinterable material includes applying a sinter film.

In another example of the fourth aspect and the above examples, applying the sinterable material includes printing a sinterable material.

In a further example of the fourth aspect and the above examples, applying the sinterable material includes dispensing a sinterable material.

In an additional example of the fourth aspect and the above examples, the conductive flow material includes a solder material, wherein securing the die to the substrate includes soldering the die to the substrate.

In another example of the fourth aspect and the above examples, the method further includes applying an interposer film to the sinterable material. For example, the interposer film includes tie-bars.

In a further example of the fourth aspect and the above examples, the method further includes applying an interposer to the die of the plurality of die following singulating.

In a fifth aspect, a method for forming an electronic device includes applying a sinterable material to a die, the die comprising electronic components formed within a semiconductor material; sintering the sinter material at a temperature in a range of 180° C. to 270° C.; and securing the die to a thermally conductive substrate with a thermally conductive flow material.

In an example of the fifth aspect, sintering the sinterable material includes applying pressure to the sinter material. For example, the pressure is in a range of 1 MPa to 25 MPa. In an example, the pressure is in a range of 5 MPa to 20 MPa. For example, the temperature is in a range of 200° C. to 250° C.

In another example of the fifth aspect and the above examples, applying the sinter material includes applying a sinter paste.

In a further example of the fifth aspect and the above examples, applying the sinter material includes applying a sinter film.

In an additional example of the fifth aspect and the above examples, applying the sinterable material includes printing a sinterable material.

In another example of the fifth aspect and the above examples, applying the sinterable material includes dispensing a sinterable material.

In a further example of the fifth aspect and the above examples, the conductive flow material includes a solder material, wherein securing the die to the substrate includes soldering the die to the substrate.

In an additional example of the fifth aspect and the above examples, the method further includes applying an interposer film to the sinterable material. For example, applying the interposer film to the sinterable material includes applying the interposer film after sintering.

Note that not all of the activities described above in the general description or the examples are required, that a portion of a specific activity may not be required, and that one or more further activities may be performed in addition to those described. Still further, the order in which activities are listed are not necessarily the order in which they are performed.

As used herein, horizontal is a plane parallel to the plane of a major surface of the semiconductor device, regardless of its orientation. Thus, a term "vertical" refers to a direction perpendicular to the horizontal as defined. Terms, such as "above," "below," "top," "bottom," "side" (as in "sidewall"), "upper," "lower," and so forth are defined with respect to the horizontal plane and along the vertical direction. Thus, the orientation of the part itself does not change the relative position denoted by such terms.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive- or and not to an exclusive- or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:
1. An electronic device comprising:
a thermally conductive substrate;
a work piece that includes
   a semiconductor die having a plurality of major surfaces including an upper surface and a lower surface, and
   a sintered metallic layer applied to the lower surface of the semiconductor die; and
a thermally conductive flow layer between a lower surface of the sintered metallic layer and the thermally con- ductive substrate, wherein the thermally conductive flow layer couples the work piece to the thermally conductive substrate.

2. The electronic device of claim 1, wherein the semiconductor die is selected from gallium nitride and silicon.

3. The electronic device of claim 1, wherein the semiconductor die comprises silicon.

4. The electronic device of claim 1, wherein the semiconductor die comprises radio frequency circuitry.

5. The electronic device of claim 1, wherein the semiconductor die has a thickness in a range of 10 µm to 50 µm.

6. The electronic device of claim 1, wherein the sintered metallic layer includes silver, gold, palladium, copper, nickel, or any combination thereof.

7. The electronic device of claim 1, wherein the sintered metallic layer has a thickness in a range of 10 µm to 200 µm.

8. The electronic device of claim 1, wherein the sintered metallic layer has a modulus in a range of 5 GPa to 25 GPa.

9. The electronic device of claim 1, wherein the sintered metallic layer has a density in a range of 40% to 95%.

10. The electronic device of claim 1, wherein the semiconductor die includes a set of vias including metal.

11. The electronic device of claim 10, wherein the sintered metallic layer is in direct contact with the metal of the vias.

12. The electronic device of claim 1, wherein the sintered metallic layer is in direct contact with the conductive flow layer.

13. The electronic device of claim 1, wherein conductive flow layer includes a solder.

14. The electronic device of claim 13, wherein the solder has a melting point in a range of 150° C. to 380° C.

15. The electronic device of claim 1, wherein the conductive flow layer has a thickness in a range of 10 µm to 50 µm.

16. The electronic device of claim 1, wherein the substrate includes a lead frame.

17. The electronic device of claim 16, wherein the lead frame is a copper lead frame.

18. The electronic device of claim 1, further comprising an interposer disposed between the sintered metallic layer and the thermally conductive flow layer.

19. The electronic device of claim 1, wherein the sintered metallic layer is applied fully to the lower surface of the semiconductor die.

20. The electronic device of claim 1, wherein the sintered metallic layer is applied in a pattern to the lower surface of the semiconductor die.

21. The electronic device of claim 1, wherein the sintered metallic layer includes silver.

22. The electronic device of claim 1, wherein the thermally conductive flow layer underlies a full lower surface of the sintered metallic layer.

23. The electronic device of claim 1, wherein the thermally conductive flow layer includes silver.

24. An electronic device comprising:
a thermally conductive substrate;
a semiconductor die disposed over the thermally conductive substrate and having a plurality of major surfaces including an upper surface and a lower surface;
a sintered metallic layer disposed between the lower surface of the semiconductor die and the thermally conductive substrate; and
a thermally conductive, silver-containing layer between a lower surface of the sintered metallic layer and the thermally conductive substrate, wherein the thermally conductive, silver-containing layer couples the sintered metallic layer and the semiconductor die to the thermally conductive substrate.

25. The electronic device of claim 24, wherein the semiconductor die is selected from gallium nitride and silicon.

26. The electronic device of claim 24, wherein the semiconductor die has a thickness in a range of 10 µm to 50 µm.

27. The electronic device of claim 24, wherein the sintered metallic layer includes silver, gold, palladium, copper, nickel, or any combination thereof.

28. The electronic device of claim 24, wherein the sintered metallic layer is a sintered silver layer.

29. The electronic device of claim 24, wherein the sintered metallic layer has a thickness in a range of 10 µm to 200 µm.

30. The electronic device of claim 24, wherein the semiconductor die includes a set of vias including metal.

31. The electronic device of claim 30, wherein the sintered metallic layer is in direct contact with the metal of the vias.

32. The electronic device of claim 24, wherein the sintered metallic layer is in direct contact with the conductive silver-containing layer.

33. The electronic device of claim 24, wherein the thermally conductive, silver-containing layer has a thickness in a range of 10 µm to 50 µm.

34. The electronic device of claim 24, wherein the thermally conductive, silver-containing layer underlies a full lower surface of the sintered metallic layer.

* * * * *